United States Patent [19]
Thornburg et al.

[11] Patent Number: 6,011,688
[45] Date of Patent: Jan. 4, 2000

[54] COMPACT APPARATUS FOR COOLING A PLURALITY OF CIRCUIT PACKS ARRANGED WITH A CAGE

[75] Inventors: Richard K. Thornburg, Loveland; Timothy A. Lock, Fort Collins, both of Colo.

[73] Assignee: Hewlett Packard Co., Palo Alto, Calif.

[21] Appl. No.: 08/868,775

[22] Filed: Jun. 4, 1997

[51] Int. Cl.[7] .................................................. H05K 7/20
[52] U.S. Cl. ...................... 361/695; 165/80.3; 361/796; 454/184
[58] Field of Search ........................... 361/687, 690–697, 361/714–722, 796; 174/16.1; 454/184; 165/80.3, 122–126; 310/68 D; 416/223 R; 415/115, 177, 178, 208.3, 213.1, 214.1

[56] References Cited

U.S. PATENT DOCUMENTS

| | | |
|---|---|---|
| 4,106,076 | 8/1978 | Miller . |
| 4,149,218 | 4/1979 | Carrubba . |
| 4,840,225 | 6/1989 | Foley . |
| 4,860,163 | 8/1989 | Sarath ...................................... 361/384 |
| 5,196,989 | 3/1993 | Zsolnay ................................... 361/383 |
| 5,218,513 | 6/1993 | Brown ..................................... 361/384 |
| 5,592,366 | 1/1997 | Goldman . |
| 5,680,294 | 10/1997 | Stora . |
| 5,680,295 | 10/1997 | Le . |
| 5,708,563 | 1/1998 | Cranston . |
| 5,808,866 | 9/1998 | Porter . |

FOREIGN PATENT DOCUMENTS

| | | | |
|---|---|---|---|
| 3316978A1 | 11/1984 | Germany ......................... H05K 7/20 |
| 0563755A1 | 10/1993 | Japan ................................ H04K 7/00 |

OTHER PUBLICATIONS

Comair Rotron, Data Sheet, Feb., 1997. Comair Rotron, 2675 Customhouse Court, San Ysidro, CA 92173. 3 pages.

HP 75000 Family of VXI Components, Systems, and Services 1996 Source Book, Hewlett–Packard Company, Palo Alto, CA; Cover sheet and pages 5.01–5.20.

*Primary Examiner*—Gerald Tolin
*Attorney, Agent, or Firm*—Jack A. Lenell

[57] ABSTRACT

A compact apparatus for cooling circuit packs disposed in a supporting cage, while providing a substantially uniform flow of coolant at enhanced volume and static pressure, and while reducing ambient noise level. The invention includes a circuit pack cage having a plurality of parallel longitudinal slots for receiving the circuit packs and for arranging the circuit packs in parallel with one another. A plenum of the invention has a plurality of parallel longitudinal troughs, wherein each trough has a respective elongated opening extending along a longitudinal dimension of the trough. The elongated openings of the troughs are arranged for proximate fluid coupling along the longitudinal dimension of each of the circuit packs adjacent to the surfaces of the circuit packs, Each trough of the plenum has a respective extremity opening, which provides for coupling with an impeller. The impeller is arranged in fluid communication with the extremity openings of the troughs, so as to provide a cooling gas flow through the troughs and over the heat generating electronic components affixed to the surfaces of the circuit packs.

19 Claims, 9 Drawing Sheets

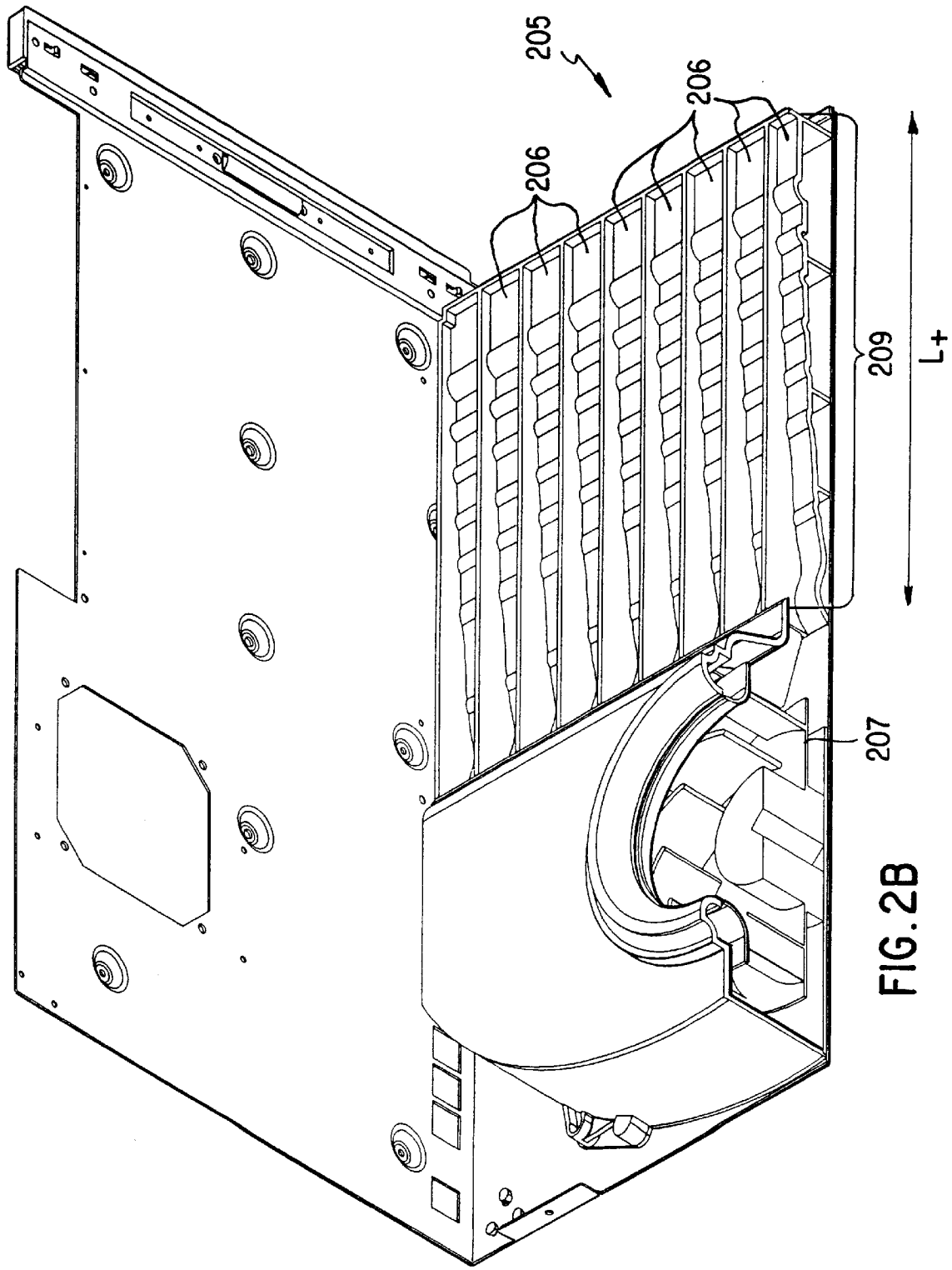

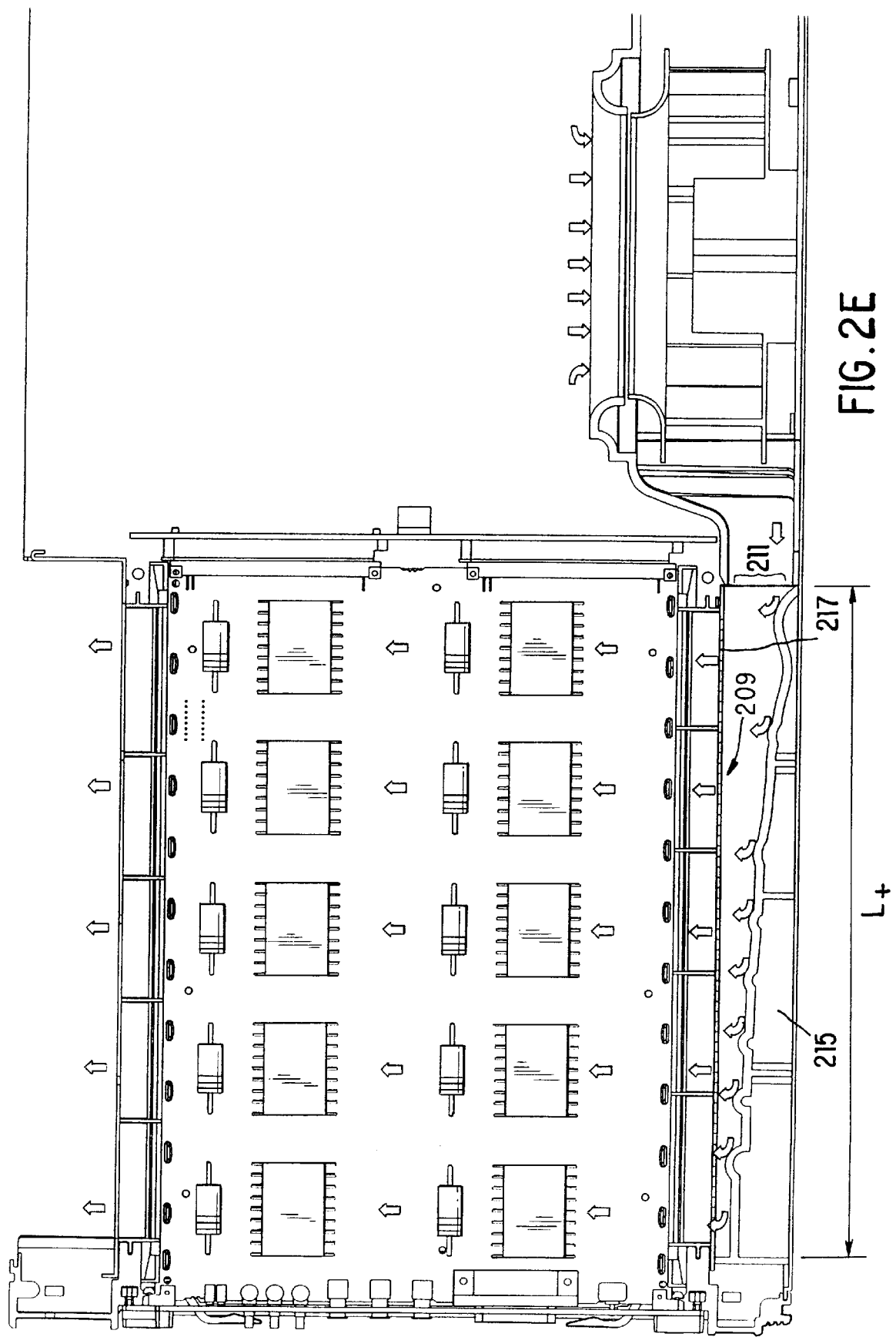

COMPACT APPARATUS FOR COOLING A PLURALITY OF CIRCUIT PACKS ARRANGED WITH A CAGE

FIELD OF THE INVENTION

The invention generally relates to a compact apparatus for cooling electronic assemblies, or circuit packs, of heat generating electronic components, and more particularly relates to a compact apparatus for cooling such circuit packs arranged within a supporting cage.

BACKGROUND OF THE INVENTION

Various compact arrangements for cooling heat generating components of circuit packs within a supporting cage are known in the prior art.

A typical example of the prior art is U.S. Pat. No. 4,860,163, issued to Alan Sarath on Aug. 22, 1989 and entitled "Communication Equipment Cabinet Cooling Arrangement", which is incorporated herein by reference for background informational purposes. A similar arrangement is shown in FIGS. 1 and 2 herein, to illustrate the background prior art.

In FIG. 1A, there is illustrated a cut-away view of a communication equipment cabinet 10 having circuit pack cage 20 inserted therein. As shown circuits packs 21 are mounted in respective circuit pack guides 22 formed in the interior of circuit pack cage 10. Each of the circuit packs 21 are shown having a number of heat generating components 26 affixed thereto.

A plurality of louvers 12 formed in front door 11 of cabinet 10 allow a stream of cooling gas, for example, air, to enter cabinet 10 and flow over and cool the heat generating components 26. The stream of cooling gas exits circuit pack cage 20 via spaces 27 formed between adjacent circuit pack guides 22 and flows into ducts 17 and 18. The stream of cooling gas flowing into ducts 17 and 18 is then directed to plenum 40 where it is exhausted by the forced convection provided by blower fan 19 mounted in proximity to rear door 16.

FIG. 1B illustrates a top cut-away view of the arrangement of FIG. 1A, in which like elements retain the same designations. As can be seen, a stream of cooling gas as represented by the direction of the arrows depicted in FIG. 1B enters cabinet 10 via louvers 12 (not shown in FIG. 1B) formed in front door 11. As shown, the flow of cooling gas is directed over the heat generating components and thence into ducts 17 and 18. Once in ducts 17 and 18, the stream of cooling gas then flows into plenum 40 where it is exhausted by blower fan 19, as discussed previously.

While such compact fan blower schemes of the prior art provide some advantages, there are also some limitations. Continuing development of circuit packs is leading to higher component densities, and to greater amounts of heat generated by ever more sophisticated electronic components, operating at ever higher frequencies. Such continuing developments require an enhanced volume of air flow (or flow of other cooling gas) at enhanced static pressures to provide cooling, while still maintaining a desirable compact arrangement.

Another requirement is to reduce the audible noise levels of cooling systems, which has been objectionable to personnel who operate the circuit packs. In some cases, high levels of audible noise has impaired operator performance. Unfortunately, when blower fan speeds are reduced to the point at which the acoustic noise levels are not objectionable to the operator, or impair operator performance, the cooling provided may be inadequate.

Another requirement is for a substantially uniform flow of air (or other cooling gas) to cool such electronic components. If the flow is not substantially uniform, there may exist inadequate cooling in specific locations within the cage. This means that when the flow is inadequate for the circuit pack, the circuit pack could experience functional deficiencies that include premature failure or produce erroneous performance results. This flow should be substantially uniform from circuit pack to circuit pack, as well as from front to rear of each circuit pack.

Previous solutions include, but are not limited to, multiple tube axial fans. The airflow from these devices must be conditioned to provide uniform distribution within the cage of circuit packs. This is difficult to accomplish due to the turbulent flow exiting these devices.

What is needed is a compact apparatus for cooling circuit packs in a supporting cage, which provides a substantially uniform flow of coolant at enhanced volume and static pressure, while reducing ambient noise level.

SUMMARY OF THE INVENTION

The present invention provides a compact apparatus for cooling circuit packs in a supporting cage, while providing a substantially uniform flow of coolant at enhanced volume and static pressure, and while reducing ambient noise level.

Briefly, and in general terms, the invention includes a supporting circuit pack cage having a plurality of parallel longitudinal slots for receiving the circuit packs and for arranging the circuit packs in parallel with one another. The circuit packs each have a respective longitudinal dimension and each have heat generating electronic components affixed to a respective surface of the circuit packs, which require cooling, A plenum of the invention has a plurality of parallel longitudinal troughs, wherein each trough has a respective elongated opening extending along a longitudinal dimension of the trough. The elongated openings of the troughs are arranged for proximate fluid coupling along the longitudinal dimension of each of the circuit packs adjacent to the surfaces of the circuit packs, Each trough of the plenum has a respective extremity opening, which provides for coupling with an impeller. The impeller is arranged in fluid communication with the extremity openings of the troughs, so as to provide a cooling gas flow through the troughs and over the heat generating electronic components affixed to the surfaces of the circuit packs.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 2B shows a detailed partial view of the preferred embodiment of the invention.

FIG. 2E shows a cut away side view of the preferred embodiment of the invention.

DETAILED DESCRIPTION OF PREFERRED EMBODIMENT

Figure 1A:
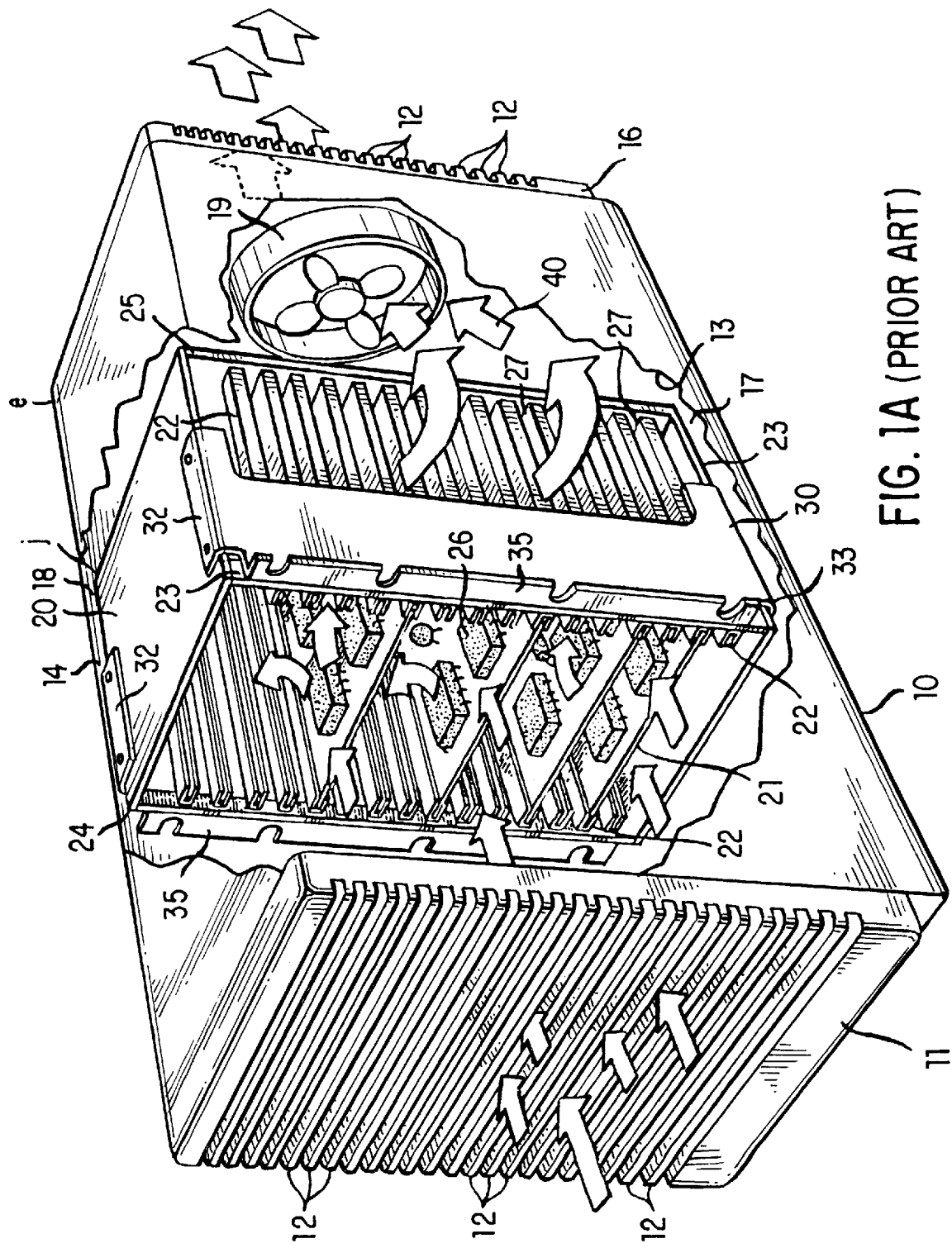
FIG. 1A shows a cut-away view of an apparatus of the prior art.
Figure 1B:
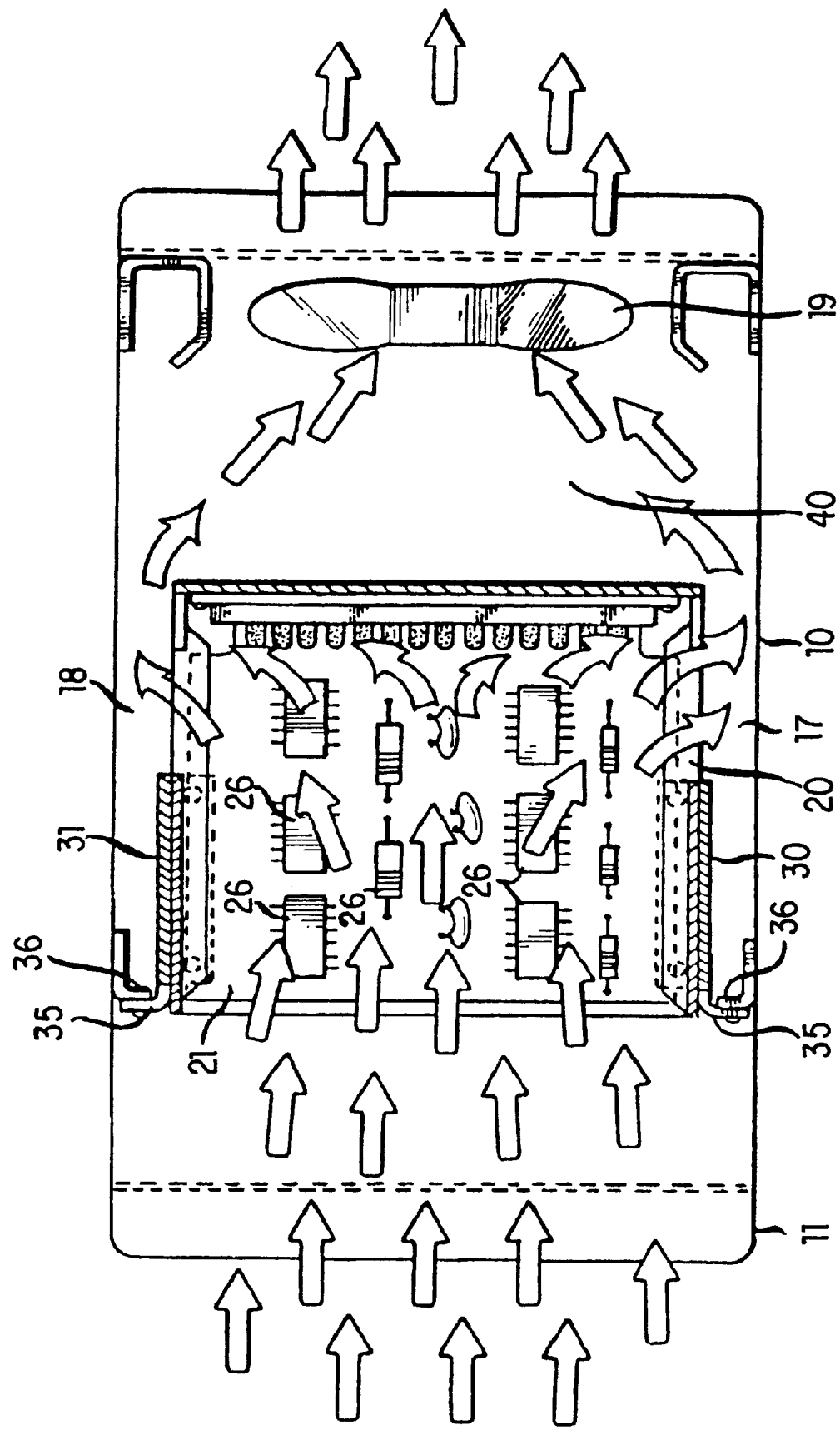
FIG. 1B shows a top cut-away view of the apparatus of FIG. 1A.
Figure 2A:
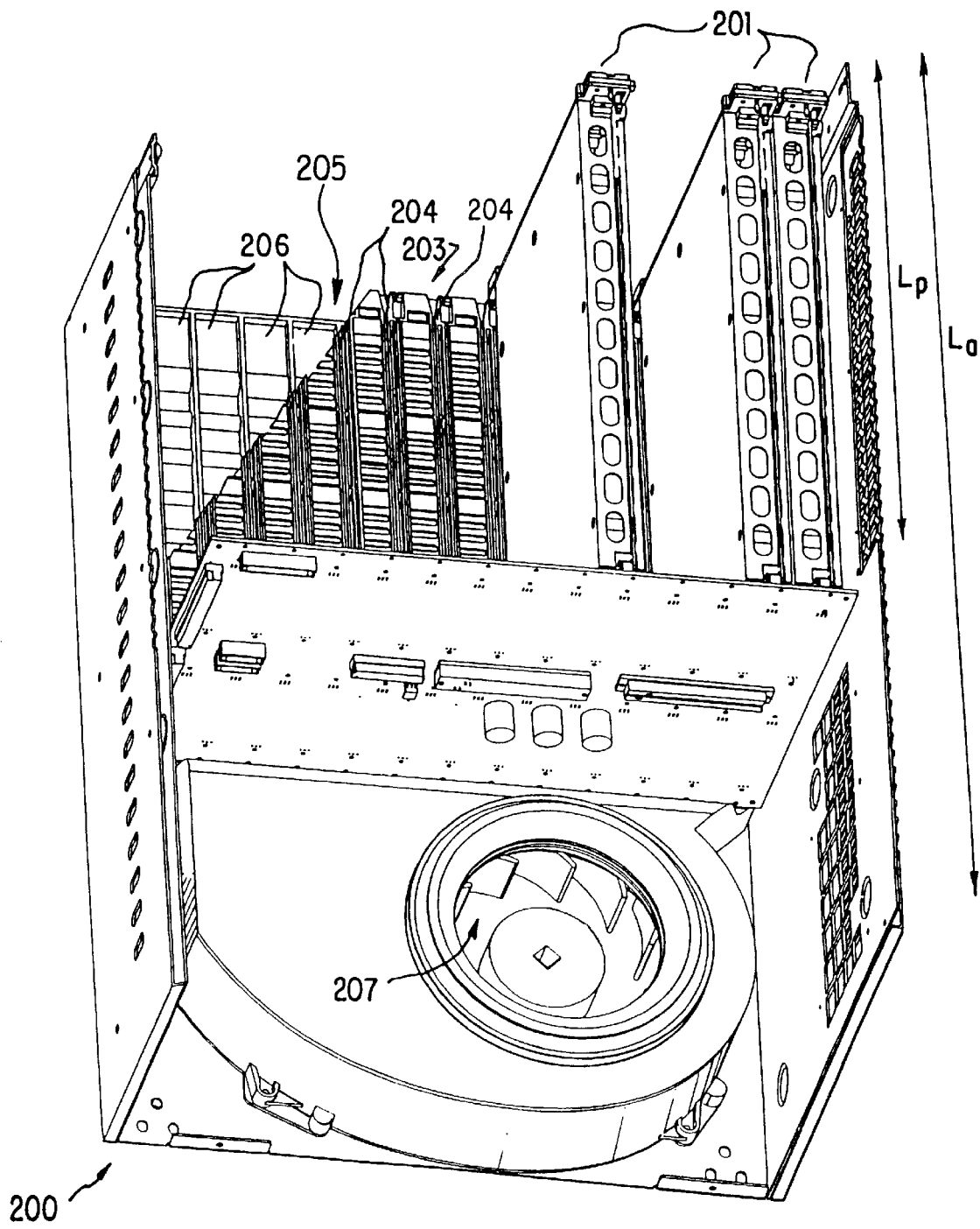
FIG. 2A, shows a cut away perspective view of the preferred embodiment of the invention.

FIG. 2A, shows a cut away perspective view of the preferred embodiment of the compact apparatus 200 of the invention for cooling a plurality of circuit packs 201 each having a respective longitudinal dimension Lp and each having heat generating electronic components affixed to a respective inner surface of the circuit packs. For purposes of the discussion herein, the compactness of the apparatus means that the longitudinal dimension La of the apparatus is less than approximately twenty seven inches. In the preferred embodiment, the longitudinal dimension of the apparatus is approximately twenty four inches. Such compactness is for the particular purpose of conveniently mounting the apparatus within equipment racks.

In the preferred embodiment, the circuit packs 201 are VXI modules (Versabus eXtensions for Instrumentation). As shown, a supporting circuit pack cage 203, preferably a VXI mainframe cage, has a plurality of parallel longitudinal slots 204 for receiving the circuit packs and for arranging the circuit packs in parallel with one another. For the sake of clarity of illustration, only a few of the circuit packs 201 are shown. It should be understood that all of the various slots 204 of cage 203 may be filled with the circuit packs 201.

A plenum 205 of the invention, shown in cut away view in FIG. 2A has a plurality of parallel longitudinal troughs 206 in fluid communication with an impeller 207 for cooling the circuit packs 201, as discussed in further detail subsequently herein. As shown in detailed partial view in FIG. 2B, each trough 206 has a respective elongated opening extending along a longitudinal dimension Lt of the trough. The elongated openings 209 of the troughs 206 are arranged for proximate fluid coupling along the longitudinal dimension of each of the circuit packs adjacent to the surfaces of the circuit packs 201 (not shown in FIG. 2b). As discussed in further detail herein, features of the troughs include ridges arranged along the longitudinal dimension Lt of the troughs. As shown the ridges are oriented perpendicular to the longitudinal dimension of the troughs.

Figure 2C:
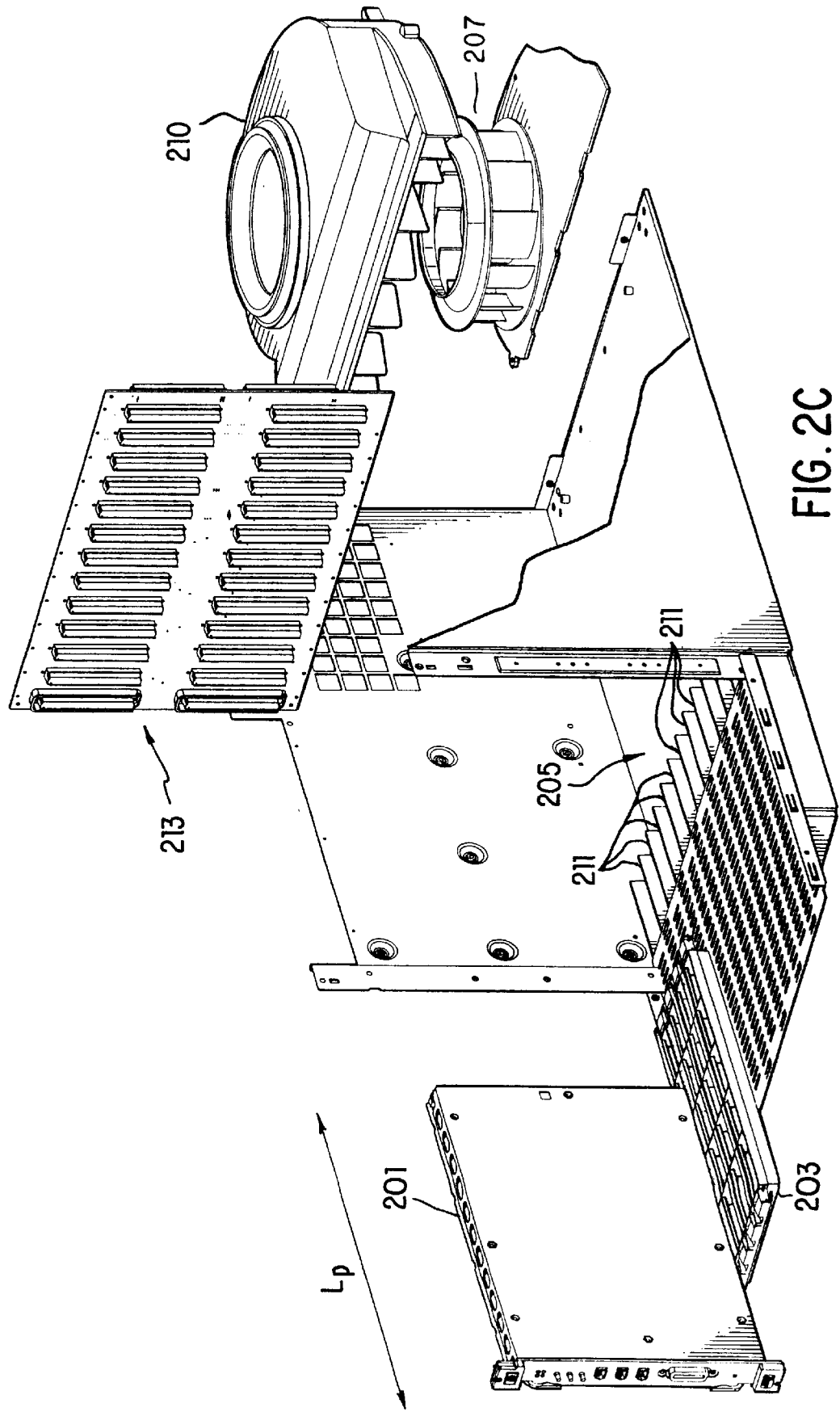
FIG. 2C shows an exploded view of the preferred embodiment of the invention.

FIG. 2C shows an exploded view of the preferred embodiment of the invention. As shown, an impeller housing 210 that encloses the impeller 207 has a lateral opening (split by vanes) for fluid coupling with the plenum 205. In the preferred embodiment, a grate having a plurality of perforations is interposed between the plenum 205 and the cage 203. As shown, each trough of the plenum 205 has a respective longitudinal extremity and a respective extremity opening 211 proximate thereto for fluid coupling with the impeller.

The cage 203 includes a backplane wiring board assembly 213, preferably a VXI backplane, having a surface for perpendicular contact with a respective longitudinal extremity of each circuit pack, so as to provide for electrical coupling with the longitudinal extremities of the circuit packs. The longitudinal extremity of each of the troughs of the plenum is arranged proximate to an extremity of the backplane so as to provide for the cooling gas flowing past the extremity of the backplane 213.

In the preferred embodiment, the impeller 207 is a backward flow impeller so as to provide a desired volume and a static pressure of the flow of the gas, and a desired limited acoustic noise level of the flow of the gas. In the preferred embodiment the volume of the flow of the gas provided by the backward flow impeller to the circuit packs is substantially within a range from approximately four liters per second to approximately seven liters per second. In the preferred embodiment the static pressure of the flow of the gas provided by the backward flow impeller is substantially within a range from approximately four tenths inches of $H_2O$ to approximately one and two tenths inches of $H_2O$. These flow rates and static pressures are for the particular purpose of providing adequate cooling for current generation, as well as future generation circuit packs.

In the preferred embodiment, the acoustic noise level of the flow of the gas provided by the backward flow impeller is substantially within a range from approximately forty three dba to fifty seven dba (deciBells A scale). These limited levels are for the particular purpose of preventing noise that would be objectionable to the operator, or impair operator performance, while still providing a sufficient cooling apparatus.

Figure 2D:
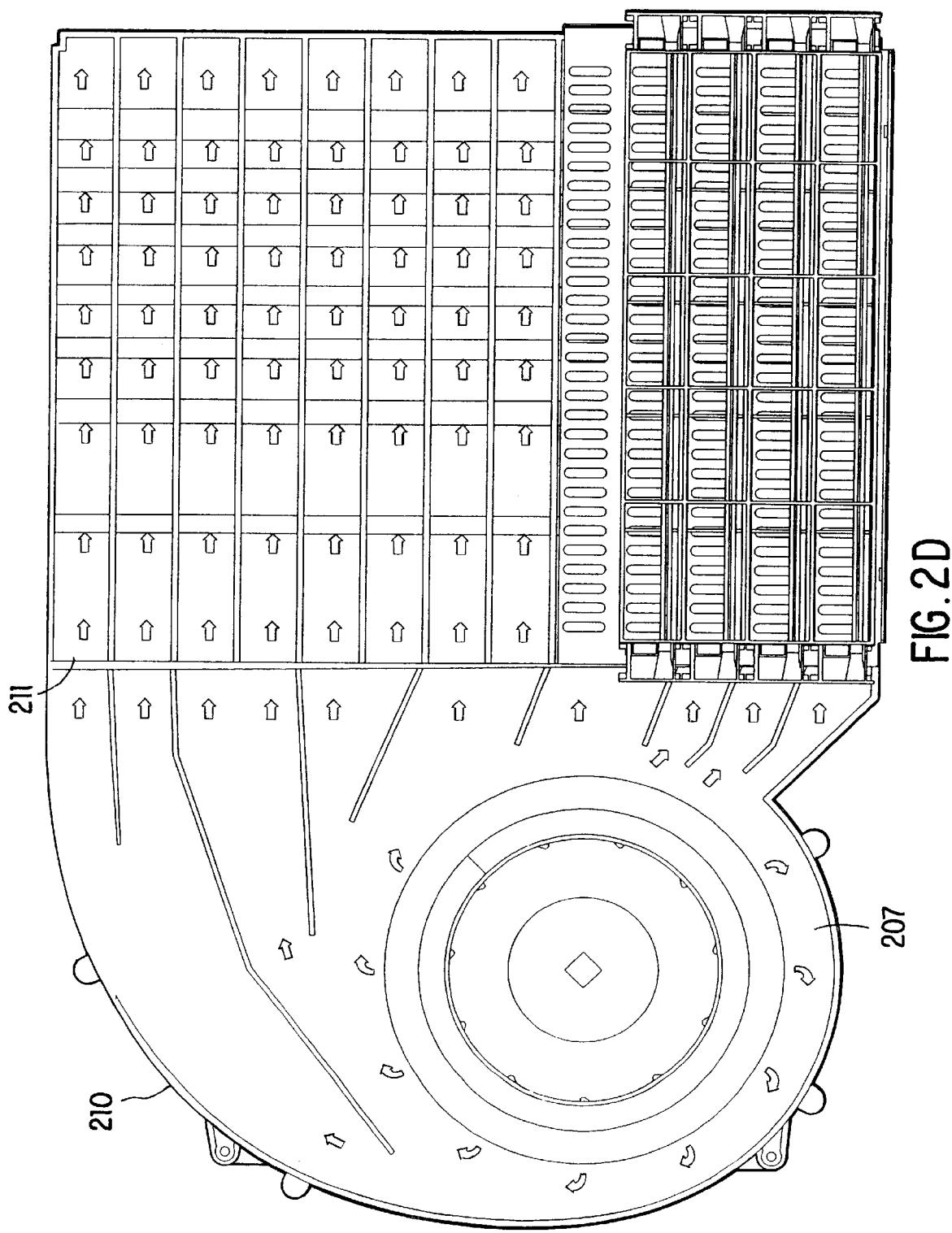
FIG. 2D shows a detailed cut away top view of the preferred embodiment of the invention.

FIG. 2D shows a detailed cut away top view of the preferred embodiment of the invention. As shown the backward flow impeller has a circumference for impelling a flow of the cooling gas outwardly therefrom. Of course, as a general matter gas flow is invisible. Accordingly, notional arrows are used in the figures to illustrate such flow.

As shown, an impeller housing 210 substantially encloses the impeller's radial flow of the cooling gas and provides a substantially parallel flow of the cooling gas though the opening in the housing. The housing preferably includes a plurality of vanes arranged therein proximate to the opening of the housing, so that the parallel flow of the cooling gas is substantially uniform along the lateral opening of the housing. For example, in the preferred embodiment, the parallel flow of the cooling gas varies by approximately plus or minus four percent along the opening of the housing. Accordingly, although there is some minor variability, the flow of the cooling gas is substantially uniform.

The impeller is arranged in fluid communication with the extremity openings 211 of the troughs, so as to provide a cooling gas flow through the troughs and over the heat generating electronic components affixed to the surfaces of the circuit packs.

FIG. 2E shows a cut away side view of the preferred embodiment of the invention, to shown the cooling gas flow through the troughs and over the heat generating electronic components affixed to the surfaces of the circuit packs. To reveal the components, shielding of the circuit pack is shown cut away.

As shown, each trough of the plenum has a respective elongated base surface 215 formed opposing the respective elongated opening 209, so that a flow of the cooling gas therethrough is substantially uniform along such elongated opening. A noteworthy feature of the preferred embodiment is that the elongated base surface of each trough of the plenum is sloped, so that a depth dimension of each trough varies along the longitudinal dimension of each trough. Another noteworthy feature is that the depth dimension of the troughs become shallower along the longitudinal dimension of the troughs as they extend away from the extremity openings of the troughs.

Yet another noteworthy feature is that the elongated base surface of each trough of the plenum is formed with a plurality of ridges perpendicular to the longitudinal dimension Lt of the troughs. In the preferred embodiment a respective number of ridges formed on the base surface of each trough is within a range from four ridges to twelve ridges. The preferred embodiment has eight ridges. Yet another noteworthy feature is that a height dimension of the ridges formed on the elongated base surface of each trough varies along the longitudinal dimension of each trough. Yet another noteworthy feature is that the height dimension of the ridges becomes higher along the longitudinal dimension of the troughs as they extend away from the extremity openings of the troughs.

Yet another noteworthy feature is that a longitudinal spacing dimension between adjacent ridges varies along the longitudinal dimension of each trough. Yet another noteworthy feature is that the longitudinal spacing dimension between ridges decreases along the longitudinal dimension of the troughs as they extend away from the extremity openings of the troughs.

It should be understood that all of these noteworthy features contribute to accomplishing the particular purpose of ensuring that the flow of the cooling gas is substantially uniform along the elongated openings of the troughs of the plenum. In there preferred embodiment, this particular purpose is also further by the perforated grate 217 disposed between the circuit packs and the elongated openings of the troughs of the plenum.

Figure 3:
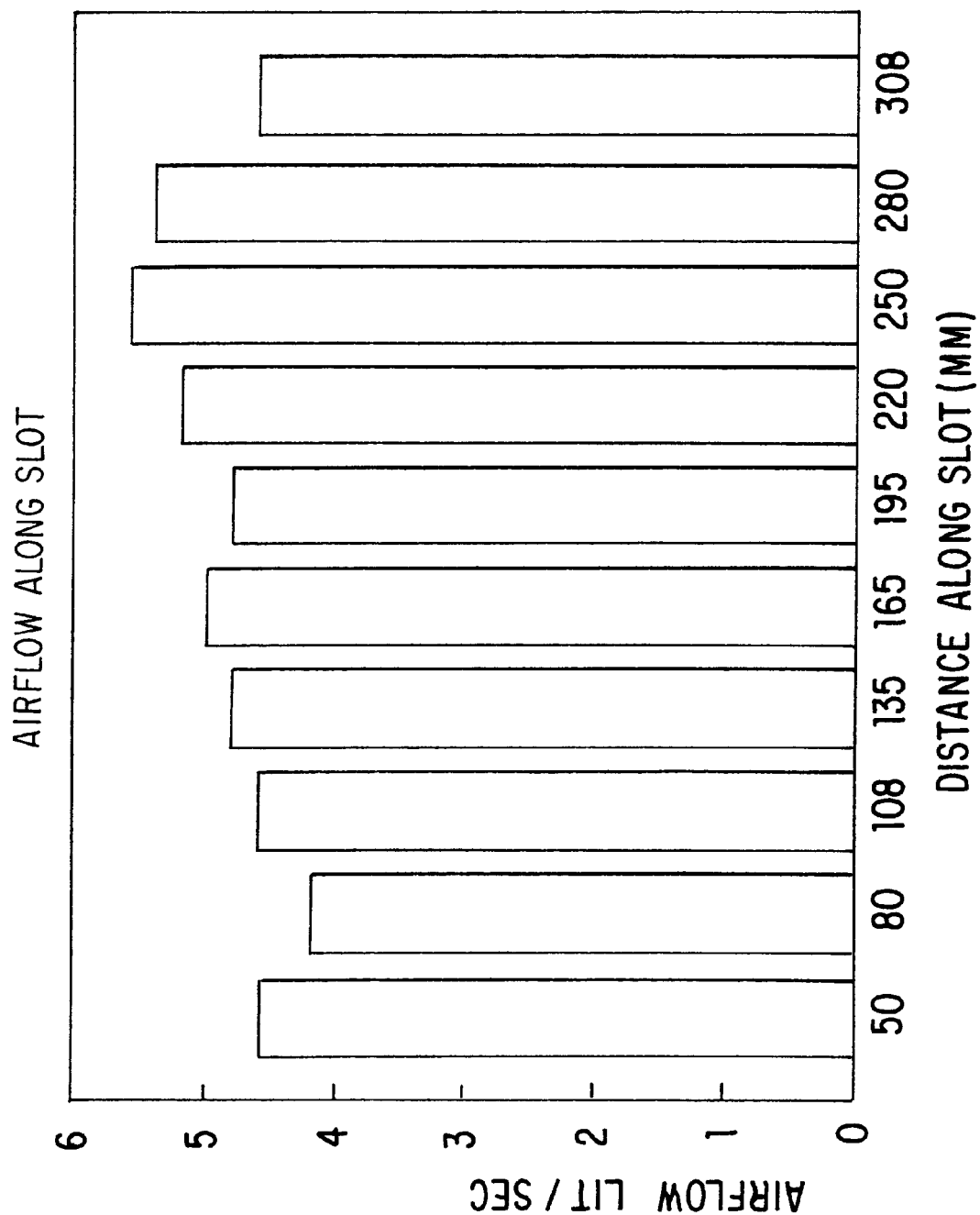
FIG. 3 is a graph illustrating an example of air flow rate along the elongated opening of one of the troughs of the plenum of the invention.

FIG. 3 is a graph illustrating an example air flow rate along the elongated openings of one of the troughs. As shown, although there is some minor variability, the flow of the cooling gas is substantially uniform along the elongated openings of the troughs of the plenum.

Figure 4:
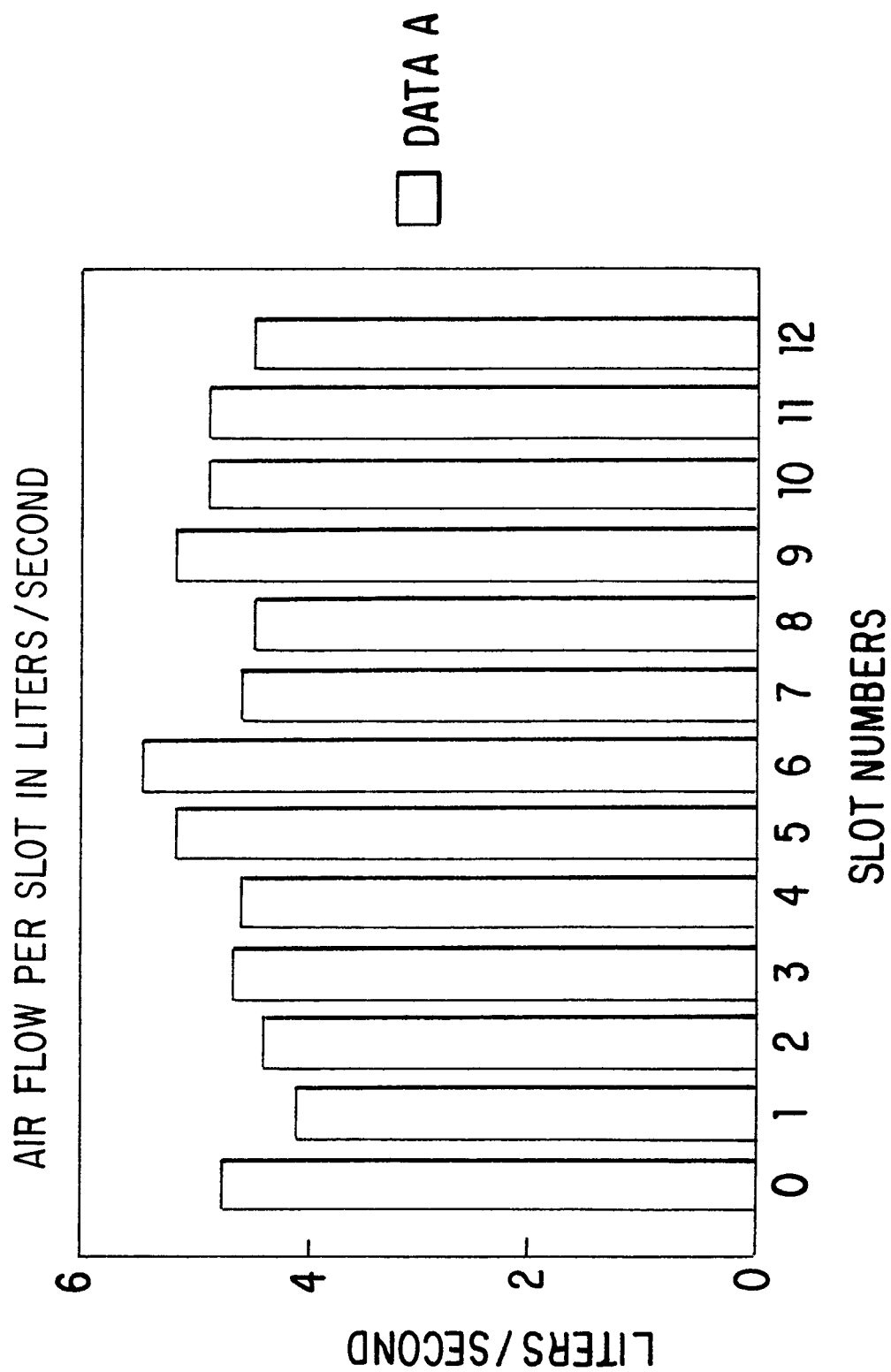
FIG. 4 is a graph illustrating air flow among the various troughs of the plenum.

FIG. 4 is a graph illustrating air flow among the various troughs of the plenum. It should be noted that comparison of air flow among the various troughs of the plenum shows that air flow is substantially uniform for all of the troughs.

As discussed, the present invention provides a compact apparatus for cooling circuit packs in a supporting cage, while providing a substantially uniform flow of coolant at enhanced volume and static pressure, and while reducing ambient noise level. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefor, the invention may be practiced otherwise than as specifically described and illustrated.

What is claimed is:

1. An apparatus cooling a plurality of circuit packs each having a respective longitudinal dimension and each having heat generating electronic components affixed to a respective surface of the circuit packs, comprising:

a circuit pack cage having a plurality of parallel longitudinal slots for receiving the circuit packs;

a plenum having a plurality of parallel longitudinal troughs, each trough having a respective elongated opening extending along a longitudinal dimension of the trough and perpendicular to the circuit packs for proximate fluid coupling along the longitudinal dimension of each of the circuit packs adjacent to the surfaces of the circuit packs, each trough further having a respective longitudinal extremity and a respective extremity opening proximate thereto; and an centrifugal impeller in direct fluid communication with the extremity openings of the troughs, so as to provide a cooling gas flow through the troughs and over the heat generating electronic components affixed to the surfaces of the circuit packs, wherein an inlet direction of the centrifugal impeller is substantially orthogonal to an exhaust direction of the centrifugal impeller.

2. An apparatus as in claim 1 wherein:

the cage includes a backplane wiring board having a surface for perpendicular contact with a respective longitudinal extremity of each circuit pack, so as to provide for electrical coupling with the longitudinal extremities of the circuit packs; and the longitudinal extremity of each of the troughs of the plenum is proximate to the backplane so as to provide for the cooling gas flowing past the backplane.

3. An apparatus as in claim 1 wherein the impeller is a backward flow impeller so as to provide a volume and a static pressure of the flow of the gas, and an acoustic noise level of the flow of the gas.

4. An apparatus as in claim 3 wherein the volume of the flow of the gas provided by the backward flow impeller is substantially within a range from approximately four liters per second to approximately seven liters per second.

5. An apparatus as in claim 3 wherein the static pressure of the flow of the gas provided by the backward flow impeller is substantially within a range from from approximately four tenths inches of $H_2O$ to approximately one and two tenths inches of $H_2O$.

6. An apparatus as in claim 3 wherein the acoustic noise level of the flow of the gas provided by the backward flow impeller is substantially within a range from approximately forty three dba to fifty seven dba (deciBells A scale).

7. An apparatus as in claim 3 wherein:

the backward flow impeller has a circumference for impelling a flow of the cooling gas outwardly therefrom; and the apparatus further comprises an impeller housing for substantially enclosing the impeller's radial flow of the cooling gas and for providing a substantially parallel flow of the cooling gas though an opening in the housing.

8. An apparatus as in claim 7 wherein the housing includes a plurality of vanes therein proximate to the opening of the housing so that the parallel flow of an cooling gas is substantially uniform along the opening of the housing.

9. An apparatus as in claim 1 wherein each trough has a respective elongated base surface formed opposing the respective elongated opening so that a flow of the cooling gas therethrough is substantially uniform along such elongated opening.

10. An apparatus as in claim 9 wherein the elongated base surface of each trough of the plenum is sloped so that a depth dimension of each trough varies along the longitudinal dimension of each trough.

11. An apparatus as in claim 10 wherein the depth dimension of the troughs become shallower along the longitudinal dimension of the troughs as they extend away from the extremity openings of the troughs.

12. An apparatus for cooling a plurality of circuit packs each having a respective longitudinal dimension and each having heat generating electronic components affixed to a respective surface of the circuit packs, comprising:

a circuit pack cage having a plurality of parallel longitudinal slots for receiving the circuit packs;

a plenum having a plurality of parallel longitudinal troughs, each trough having a respective elongated opening extending along a longitudinal dimension of the trough for proximate fluid coupling along the longitudinal dimension of each of the circuit packs adjacent to the surfaces of the circuit packs, each trough further having a respective longitudinal extremity and a respective extremity opening proximate thereto; and an impeller in fluid communication with the extremity openings of the troughs, so as to provide a cooling gas flow through the troughs and over the heat generating electronic components affixed to the surfaces of the circuit packs, wherein:

each trough has a respective elongated base surface formed opposing the respective elongated opening so that a flow of the cooling gas therethrough is substantially uniform along such elongated opening; and the elongated base surface of each trough of the plenum is formed with a plurality of ridges perpendicular to the longitudinal dimension of the troughs.

13. An apparatus as in claim 12 wherein a height dimension of the ridges formed on the elongated base surface of each trough varies along the longitudinal dimension of each trough.

14. An apparatus as in claim 13 wherein the height dimension of the ridges becomes higher along the longitudinal dimension of the troughs as they extend away from the extremity openings of the troughs.

15. An apparatus as in claim 12 wherein a longitudinal spacing dimension between adjacent ridges varies along the longitudinal dimension of each trough.

16. An apparatus as in claim 15 wherein the longitudinal spacing dimension between ridges decreases along the longitudinal dimension of the troughs as they extend away from the extremity openings of the troughs.

17. An apparatus as in claim 12 wherein a respective number of ridges formed on the base surface of each trough is within a range from four to twelve ridges.

18. An apparatus as in claim 1 further comprising a perforated grate extending between the circuit packs and the elongated openings of the troughs of the plenum.

19. An apparatus as in claim 1 wherein the apparatus is a compact apparatus having a longitudinal dimension less than approximately twenty seven inches.

* * * * *